(12) United States Patent
Yin et al.

(10) Patent No.: US 11,105,849 B1
(45) Date of Patent: Aug. 31, 2021

(54) MULTI-STATION CONCURRENT TESTING METHOD, CONTROL STATION AND MULTI-STATION CONCURRENT TESTING APPARATUS

(71) Applicant: BEIJING HUAFENG TEST & CONTROL TECHNOLOGY CO., LTD, Beijing (CN)

(72) Inventors: Shilong Yin, Beijing (CN); Peng Zhou, Beijing (CN); Huaiyu Mao, Beijing (CN); Yunkun Zhao, Beijing (CN); Huipeng Liu, Beijing (CN); Su Yan, Beijing (CN); Wei Zhou, Beijing (CN)

(73) Assignee: BEIJING HUAFENG TEST & CONTROL TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 17/256,820

(22) PCT Filed: Jun. 29, 2018

(86) PCT No.: PCT/CN2018/093781
§ 371 (c)(1),
(2) Date: Dec. 29, 2020

(87) PCT Pub. No.: WO2020/000410
PCT Pub. Date: Jan. 2, 2020

(51) Int. Cl.
*B65G 43/10* (2006.01)
*B65G 47/80* (2006.01)
(Continued)

(52) U.S. Cl.
CPC ......... *G01R 31/2893* (2013.01); *B65G 43/10* (2013.01); *B65G 47/80* (2013.01); *G06F 11/273* (2013.01); *B65G 2203/0233* (2013.01)

(58) Field of Classification Search
CPC ............ G01R 31/2893; G01R 31/2874; G01R 31/2891; G01R 1/0458; B65G 47/80;
(Continued)

(56) References Cited

U.S. PATENT DOCUMENTS

| 2015/0022231 A1 | 1/2015 | Lee et al. |
| 2017/0010313 A1* | 1/2017 | How .................... G01R 31/003 |

(Continued)

FOREIGN PATENT DOCUMENTS

| CN | 101667273 A | 3/2010 |
| CN | 105074482 A | 11/2015 |
| CN | 106391512 A | 2/2017 |

*Primary Examiner* — Alvaro E Fortich
*Assistant Examiner* — Zannatul Ferdous
(74) *Attorney, Agent, or Firm* — Shumaker, Loop & Kendrick, LLP; John A. Miller

(57) ABSTRACT

A multi-station concurrent testing method, comprising: a step A in which the control station controls the handler to send SOT signal(s) of corresponding testing station(s) based on previous testing results at adjacent testing stations of the testing stations; a step B in which the control station constructs an SOT signal sequence based on the received SOT signal(s) and in correspondence to orders of the testing stations; and a step C in which the control station compares the SOT signal sequence and an SOT signal prediction value sequence generated by the control station, wherein if the SOT signal sequence and the SOT signal prediction value sequence match, the corresponding testing station(s) executes the test of device(s) under test, and otherwise, the handler is controlled to purge the devices under test at the testing stations, the SOT signal prediction value sequence is generated based on previous testing results at the testing stations.

15 Claims, 10 Drawing Sheets

(51) Int. Cl.
*G06F 11/273* (2006.01)
*G01R 31/28* (2006.01)

(58) Field of Classification Search
CPC ............ B65G 43/10; B65G 2203/0233; G06F
11/273; G06F 11/3664; G06F 11/3668;
G06F 13/1673; H04B 7/0404; H04B
17/17
See application file for complete search history.

(56) References Cited

U.S. PATENT DOCUMENTS

2017/0131346 A1* 5/2017 Roberts, Jr. ......... G01R 31/2865
2019/0101587 A1* 4/2019 Watanabe .......... G01R 31/2884
2019/0162767 A1* 5/2019 Wang ................... G01R 31/002

* cited by examiner

| | | Parameter | Unit | Min | Max | Site1 | | Site2 | | Site3 | Site4 |
|---|---|---|---|---|---|---|---|---|---|---|---|
| Timing sequence A2 | | | | | | DUT2 | | DUT1 | | | |
| | | | | | | Sbin; 0 P | | Sbin; 1 P | | | |
| | Site1 | ICC | A | 0 | 18 | 4.00 | | 2.00 | | | |
| | Site1 | Example | mA | 0 | 18 | 19.00 | | 12.00 | | | |
| | Site1 | Vst | V | 0 | 18 | 13.00 | | 8.00 | | | |
| | Site2 | Vespre | V | -10 | 18 | | | 14.00 | | | |
| | Site2 | PS8R | V | 0 | 18 | | | 15.00 | | | |
| | Site2 | T_delay | V | -10 | 18 | | | 8.00 | | | |
| | Site3 | Vespre1 | V | -20 | 18 | | | | | | |
| | Site3 | PS8R1 | V | 0 | 18 | | | | | | |
| | Site3 | T_delay1 | V | -20 | 18 | | | | | | |

| | | Parameter | Unit | Min | Max | Site1 | Site2 | Site3 | Site4 |
|---|---|---|---|---|---|---|---|---|---|
| | | | | | | DUT1 | DUT3 | DUT2 | DUT1 |
| | | | | | | Shim 1 P | Shim 1 P | Shim 0 P | Shim 1 P |
| Timing sequence A4 | Site1 | ICC | A | 0 | 18 | 3.00 | 5.00 | | 2.00 |
| | Site1 | Example | mA | 0 | 18 | 9.00 | 10.00 | | 12.00 |
| | Site1 | Vst | V | 0 | 18 | 3.00 | 8.00 | | 8.00 |
| | Site2 | Vespre | V | -10 | 18 | | 13.00 | | 14.00 |
| | Site2 | PSRR | V | 0 | 18 | | 10.00 | | 15.00 |
| | Site2 | T_delay | V | -10 | 18 | | 5.00 | | 8.00 |
| | Site3 | Vespre1 | V | -20 | 18 | | | | 8.00 |
| | Site3 | PSRR1 | V | 0 | 18 | | | | 14.00 |
| | Site4 | T_delay1 | V | -20 | 18 | | | | 5.00 |

| | Timing sequence A1 | Timing sequence A2 | Timing sequence A3 | Timing sequence A4 |
|---|---|---|---|---|
| Site1 | DUT1 | DUT2 failed | DUT3 | DUT4 |
| Site2 | ---- | DUT1 | DUT2 skipped | DUT3 |
| Site3 | ---- | ---- | DUT1 | DUT2 skipped |
| Site4 | ---- | ---- | ---- | DUT1 |
| Corresponding SOT signal sequence | 1000 | 1100 | 1010 | 1101 |

```
Sot Error Message

Others Count:    4

[20140929 11:04:57] SOT signal error.   Expected sot: X 1 0 0    Receive sot: 1 1 0 1
[20140929 11:11:02] SOT signal error.   Expected sot: X 1 1 1    Receive sot: 1 0 0 0
[20140929 11:11:16] SOT signal error.   Expected sot: X 0 0 0    Receive sot: 0 0 1 0
```

MULTI-STATION CONCURRENT TESTING METHOD, CONTROL STATION AND MULTI-STATION CONCURRENT TESTING APPARATUS

CROSS-REFERENCE TO RELATED APPLICATIONS

This application is a National Stage application of International Application No. PCT/CN2018/093781 filed on Jun. 29, 2018.

BACKGROUND

Field

The present disclosure relates generally to the field of testing integrated circuits and, more particularly, to a multi-station concurrent testing method, a control station and a multi-station concurrent testing apparatus.

Discussion of the Related Art

In testing of a batch of sophisticated devices (including both ICs and MOSFETs), a great number of parameters are tested, including performance parameters of the ICs, and UIS (Unclamped Inductive Switching), thermal resistance, driving capacitance, driving resistance, and likes of the MOSFETs. In the actual testing process of these parameters, multiple testing hardware facilities generally are required to test the batch of devices separately. The parameters to be tested could be different for each of the testing hardware facilities, and the number of parameters to be tested could also be different.

FIG. 1 illustrates a conventional multi-station concurrent testing apparatus, which includes a handler 300 and multiple testing hardware facilities (also referred to as testing stations) 210, 220, 230, and 240. The handler 300 sends an SOT (Start of Test) signal to the testing hardware facilities 210, 220, 230, and 240 respectively, and receives an EOT (End of Test) signal and a BIN (Bin Category Lines) signal fed back by each of the testing hardware facilities. The testing hardware facilities test each of the devices separately, and upload the testing results generated by them respectively to a server 100.

Since these testing hardware facilities may belong to different testing systems or testing instruments, the main disadvantage of this kind of separate testing is that the testing results of the same device at the testing stations are stored separately, so that all the testing results of the particular device cannot be directly presented. Furthermore, since the testing results are stored separately so that the testing results cannot be put together, the device under test cannot be binned by compound binning mode using testing result from multiple testing stations.

In this regard, a concurrent testing scheme with multiple testing stations is also currently provided to achieve post integration of the testing results. In this scheme, a consecutive feeding of various devices is achieved by handlers.

Specifically, in the process of testing the batch of devices, each of the testing stations uploads the testing result of each of the devices to a server separately, and the server stores the testing result separately so as to perform data integration at a later stage.

In the case that the test of a certain device under test at a certain testing station fails or is not performed, the testing result of the certain device under test will not be generated and uploaded, and the server is not aware of this situation. When the server receives the testing result of the next device under test tested at the certain testing station, it stores this testing result of the next device under test as the testing result of the certain device under test, which will cause a data dislocation in data integration for the testing results of the devices at later stage, and lead to errors in the statistics data generated by the server. Therefore, there is a need to provide a concurrent testing method, which can achieve a one-to-one correspondence between the devices under test and the testing results, thereby avoiding data dislocation in data integration of all the testing results of the devices.

SUMMARY

In view of this, a main objective of the present disclosure is to provide a multi-station concurrent testing method, which can not only realize tests of all parameters of devices under test at one testing system, but also integrate all the testing results of the devices, thereby realizing one-to-one correspondence between the devices under test and the testing results, preventing data dislocation, saving test time and test cost, and improving test efficiency.

In order to achieve this objective, the technical scheme adopted by the present disclosure is:

a multi-station concurrent testing method, including a control station, a plurality of testing stations which are respectively in communication connection with the control station, wherein different testing stations are configured to test a part of parameters of devices under test and provide the parameters to the control station;

and a handler in communication connection with the control station, wherein the handler is configured to convey the devices under test to be placed at the testing stations in sequence; the testing method includes:

a step A, in which the control station controls the handler to send SOT signal(s) of corresponding testing station(s) according to previous testing results at adjacent testing stations of the testing stations;

a step B, in which the control station constructs an SOT signal sequence according to the received SOT signal(s) and in correspondence to orders of the testing stations;

a step C, in which the control station compares the SOT signal sequence and a SOT signal prediction value sequence generated by the control station, wherein the corresponding testing station(s) preforms the tests of the device(s) under test if the two sequences match, and otherwise, the handler is controlled to purge the devices under test at the testing stations, the SOT signal prediction value sequence is generated according to previous testing results at the testing stations.

The parameters of the device under test are distributed into a plurality of testing stations for testing. The control station generates an SOT signal prediction value sequence according to the previous testing result at the testing stations, and controls sending of the SOT signals of corresponding testing station(s) by the handler so as to make them to match each other. Once the test of the device under test at one testing station has finished, test data are generated for displaying. The device under test is then controlled to enter the next testing station according to the testing sequence, and the test data can be combined into the next testing station. In such a way, it can not only realize the test of all the parameters of the device under test at the same test system to save test cost, but also integrate all the test data of the device under test and realize a one-to-one correspondence between the device under test and the testing results to prevent data dislocation.

Wherein, the said step A includes:

when a device under test is placed at a first testing station by the handler, the handler sends a corresponding SOT signal of the first testing station; and when the device under test is placed at a (N+1)th testing station by the handler, N is more than or equal to 1, the handler sends an corresponding SOT signal of the (N+1)th testing station if the testing result of the device under test at a Nth testing station is in line with the expectation, or the handler does not send the corresponding SOT signal of the (N+1)th testing station if the testing result of the device under test at the Nth testing station is not in line with the expectation or the test is skipped at the Nth testing station.

In this way, a complete testing of the device under test from the first testing station to the last testing station can be guaranteed according to SOT signal sending rules. Each testing station determines whether the SOT signal is sent or not according to the testing result at its previous testing station. When the test of the device under test at a certain testing station fails, the device under test can enter the subsequent testing station along with the handler, but it will no longer be tested according to the rules. Therefore, the test time is saved, and meanwhile, the test data can be prevented from being dislocated.

Wherein, the step B includes the following.

If the SOT signal of one of the testing stations is received, a value at a position of the SOT signal sequence corresponding to that testing station is 1, and otherwise, the value at the position is 0.

From the above, 1 represents a high level with the SOT signal, and 0 represents a low level without the SOT signal, and a high-level and low-level SOT signal sequence is constructed therefrom.

Wherein, the step of the step C in which the SOT signal prediction value sequence is generated based on previous testing results at the testing stations includes:

a step of generating a value at a first position of the SOT signal prediction value sequence: the value at the first position is 1 when a new device under test enters a first testing station, and the value at the first position is 0 when no new device under test enters the first testing station; and a step of generating values at other positions of the SOT signal prediction value sequence: the values at the other positions corresponds respectively to the testing results at previous adjacent testing stations of the testing stations, wherein the value at a certain position of the SOT signal prediction value sequence is 1 if a previous testing result at a certain testing station has been passed, wherein the certain position is a position next to the position corresponding to the certain testing station, and the value at the certain position is 0 if the previous testing result at the certain testing station has failed.

In this way, the control station generates an SOT signal prediction value sequence according to whether there is the device under test at the first testing station and the testing results of the devices under test after entering the other testing stations. In the case where the test of a device under test at the testing station passes and the device under test then enters the next testing station, the handler should send the SOT signal. In the case where the test of the device under test at the testing station does not pass and the device under test then enters the next testing station, the handler should not send the SOT signal.

In a further improvement, after the corresponding testing station(s) executes the test of device(s) under test, the step C further includes:

the control station stores the testing results of the devices under test at different testing stations, and combines and displays the testing results of the devices under test, which have been generated, in correspondence to the device under test.

In this way, when the testing results of the device under test recorded by the testing stations moves to the next testing station along with the device under test during the testing process, the test records are subjected to text combination and all the test values are displayed at the testing station where the device under test is located currently.

In a further improvement, after purging the devices under test at the testing stations, the step C further includes:

reporting an SOT error massage and storing the error message in an error report file.

In this way, if the SOT signal sequence constructed by the SOT signals sent by the handler is inconsistent with the SOT signal prediction value sequence generated by the control station, the system can report an SOT error massage and stores the generated time of the SOT error massage and the comparison error information between the SOT signal sequence and the SOT signal prediction value sequence in an error report file, so that the operator can conveniently check the error reporting information.

In a further improvement, ends of the handler in contact with the devices under test are installed with sensors for detecting in-position states of the devices under test on the handler.

In this way, the sensors on the handler can detect whether the device under test on the handler is positioned or not. The handler sends a SOT signal when the device under test is in the in-position state, and otherwise, the handler does not send the SOT signal.

The present disclosure also provides a control station, which includes a processor and multi-station concurrent test software running on the processor, wherein the multi-station concurrent test software executes:

a step A of controlling, according to previous testing results of adjacent testing stations of testing stations, a handler to send SOT signal(s) of corresponding testing station(s);

a step B of constructing an SOT signal sequence according to the received SOT signal(s) and in correspondence to orders of the testing stations;

a step C of comparing the SOT signal sequence and a SOT signal prediction value sequence generated by the control station, wherein if the SOT signal sequence and the SOT signal prediction value sequence match, the corresponding testing station(s) executes the test of device(s) under test, and otherwise, the handler is controlled to purge the devices under test at the testing stations;

the SOT signal prediction value sequence is generated according to previous testing results at the testing stations.

Wherein, the step A includes:

when a device under test is placed at a first testing station by the handler, the handler sends the SOT signal of the first testing station; and when the device under test is placed at a (N+1)th testing station by the handler, N is more than or equal to 1, the handler sends corresponding SOT signal of a (N+1)th testing station if the testing result of the device under test at a Nth testing station is in line with the expectation, and the handler does not send the corresponding SOT signal of the (N+1)th testing station if the testing result is not in line with the expectation or the test is skipped.

Wherein, the step B includes:

if the SOT signal of one of the testing stations is received, a value at a position of the SOT signal sequence corresponding to that testing station is 1, and otherwise, the value at the position is 0.

Wherein, the step of the step C in which the SOT signal prediction value sequence is generated according to previous testing results at the testing stations includes:

a step of generating a value at a first position of the SOT signal prediction value sequence: the value at the first position is 1 when a new device under test enters a first testing station, and the value at the first position is 0 when no new device under test enters the first testing station; and a step of generating values at other positions of the SOT signal prediction value sequence: the values at the other positions corresponds respectively to the testing results at previous adjacent testing stations of the testing stations, wherein the value at a certain position of the SOT signal prediction value sequence is 1 if a previous testing result at a certain testing station has been passed, wherein the certain position is a position next to the position corresponding to the certain testing station, and the value at the certain position is 0 if the previous testing result at the certain testing station has failed.

In a further improvement, after the corresponding testing station(s) executes the test of device(s) under test, the step C further includes:

storing the testing results of the devices under test at different testing stations, and combining and displaying the testing results of the devices under test, which have been generated, in correspondence to the devices under test.

In a further improvement, after removing the devices under test at the testing stations, the step C further includes:

reporting an SOT error massage and storing the error massage in an error report file.

The present disclosure also provides a multi-station concurrent testing system, which includes the above control station, a plurality of testing stations which are respectively in communication connection with the control station, wherein different testing stations are configure to test a part of parameters of devices under test and provide the parameters to the control station;

and a handler in communication connection with the control station, wherein the handler is configured to convey the devices under test to be placed at the testing stations in sequence.

In a further improvement, ends of the handler in contact with the devices under test are installed with sensors for detecting in-position states of the devices under test on the handler.

DETAILED DESCRIPTION OF THE EMBODIMENTS

A major purpose of the present disclosure is to provide a multi-station concurrent testing method. This method allows multiple testing stations to test different parameters by predetermined rules, thereby realizing sequential tests of all parameters of devices under test at the testing stations and data integration. In addition to that, the method further realizes concurrent tests of multiple devices under test at the testing stations and ensures one-to-one correspondence between the devices under test and the testing results, thereby preventing data dislocation, saving test time and test cost, and improving test efficiency.

Figure 1:
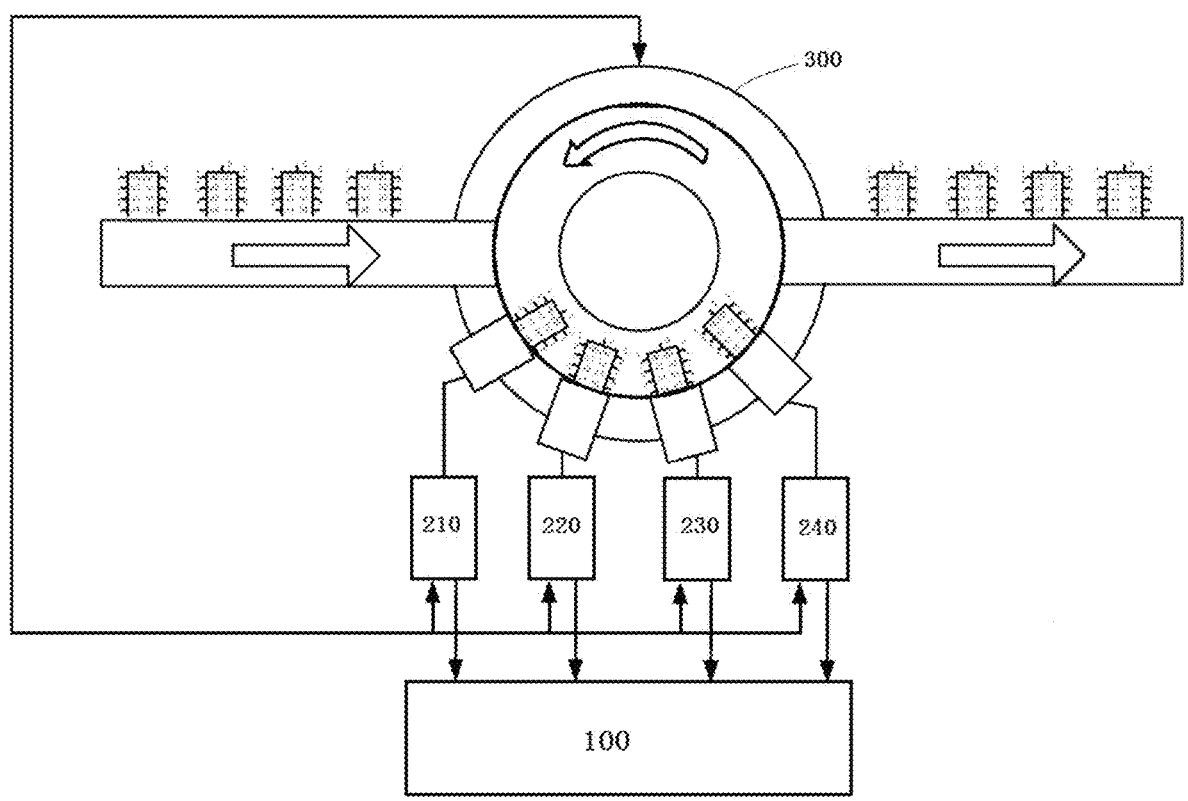
FIG. 1 is a schematic diagram of a conventional multi-station concurrent testing apparatus.
Figure 2:
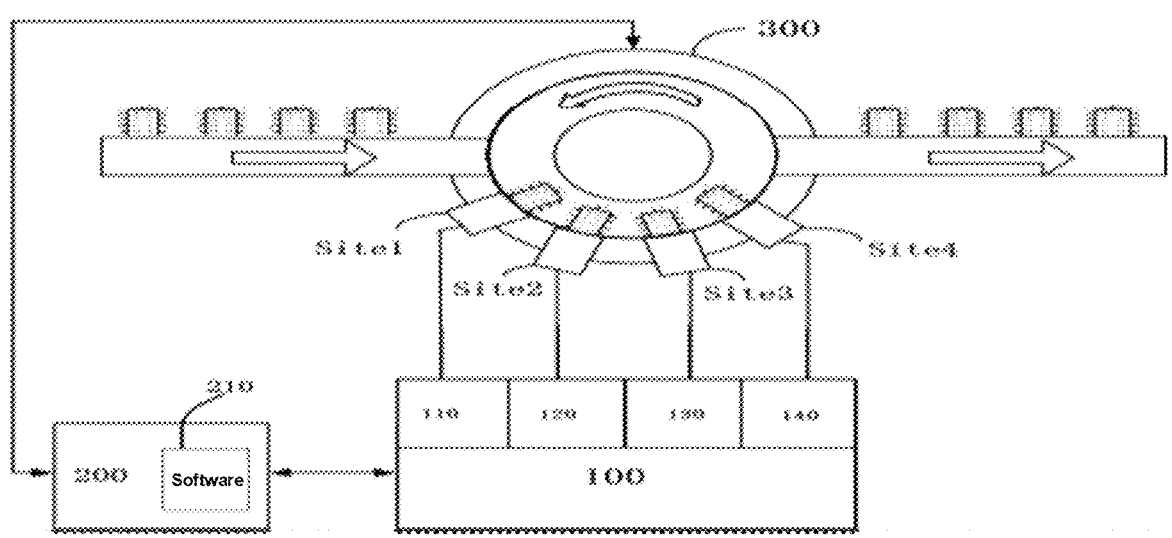
FIG. 2 is a schematic diagram of a multi-station concurrent testing apparatus according to an embodiment of the present disclosure.

As shown in FIG. 2, the present disclosure provides a multi-station concurrent testing apparatus, which includes a control station 200 and a testing host 100 that are sequentially connected in a communication manner, wherein the control station 200 is installed with a multi-station concurrent testing software 210, and the control station 200 may use a PC (personal computer) or other processor supporting installation of the multi-station concurrent testing software 210.

The control station 200 and the testing host 100 are in communication connection via a bus. The testing host 100 includes a plurality of hardware modules 110, 120, 130 and 140, which are respectively connected with at least one testing station to form a first to fourth testing stations Site1, Site2, Site3 and Site4. The four testing stations are respectively used for testing a part of parameters of the devices under test. The testing results of the part of the parameters are uploaded to the control station 200 by the testing host 100.

The testing apparatus further includes a handler 300 in communication connection with the control station 200 for controlling the entry and exit of the devices under test at the testing stations and controlling the switching of the devices under test among the testing stations. Sensors may be mounted on the handler 300 to detect the in-position states of the devices under test on the handler.

The communication means between the control station 200 and the handler 300 includes GPIB, TTL, RS232, and the like.

Figure 3:
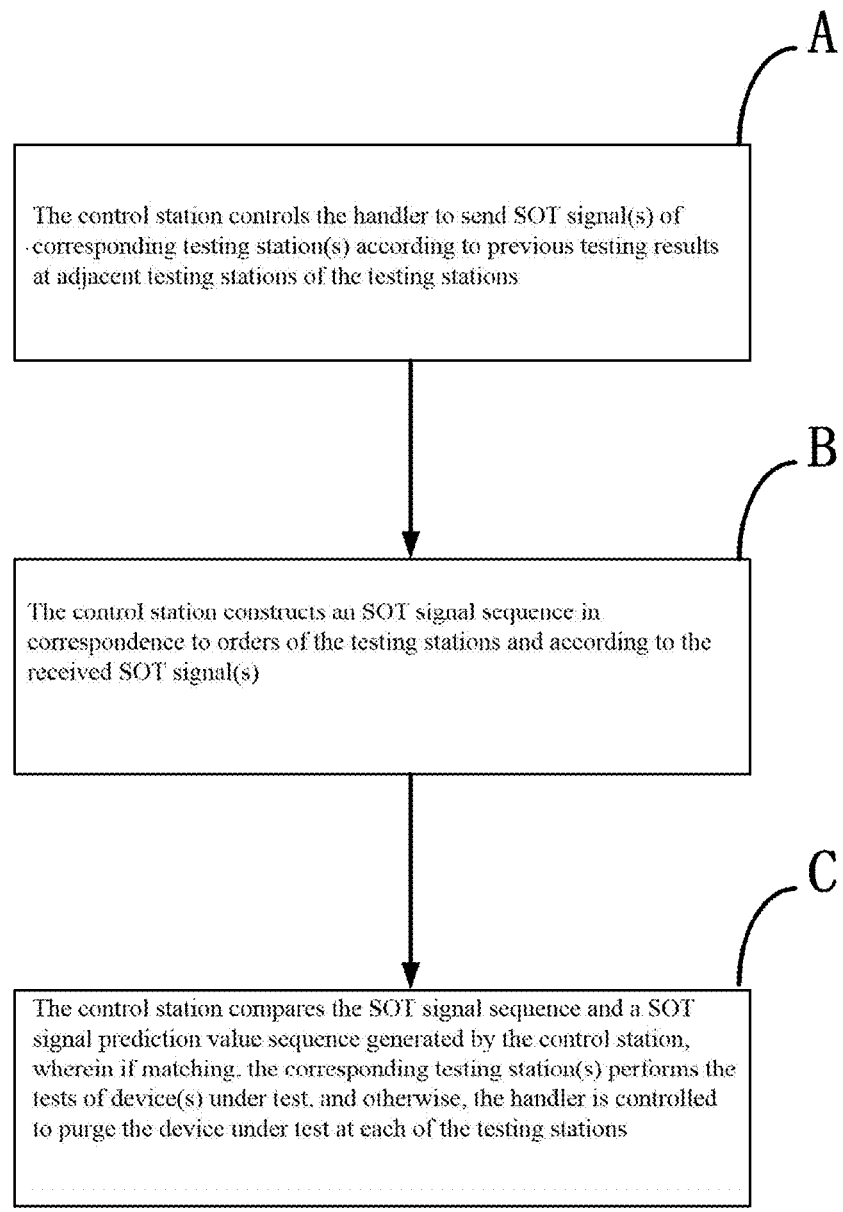
FIG. 3 is a flow chart of a multi-station concurrent testing method according to an embodiment of the present disclosure.

As shown in FIG. 3, in combination with the above multi-station concurrent testing apparatus, there is also provided a multi-station concurrent testing method, which includes steps A to C.

In the step A, the control station controls the handler to send SOT signal(s) of corresponding testing station(s) according to previous testing results at adjacent testing stations of the testing stations.

Specifically, when a device under test is placed at a first testing station by the handler, the handler sends a corresponding SOT signal of the first testing station.

When the device under test is placed at a (N+1)th testing station by the handler, N is more than or equal to 1, the handler sends a corresponding SOT signal of the (N+1)th testing station if a testing result of the device under test at a Nth testing station is in line with the expectation, or the handler does not send the corresponding SOT signal of the (N+1)th testing station if the testing result of the device under test at the Nth testing station is not in line with the expectation or no test on the device under test is performed at the Nth testing station.

In the step B, the control station constructs an SOT signal sequence in correspondence to orders of the testing stations and according to the received SOT signal(s). A value at any position of the SOT signal sequence corresponding to one of the testing stations is 1 if the SOT signal of the one of the testing stations is received, and the value is otherwise 0.

In the step C, the control station compares the SOT signal sequence and a SOT signal prediction value sequence generated by the control station. If the SOT signal sequence and the SOT signal prediction value sequence match, the corresponding testing station(s) perform the test of device(s) under test, the control station stores the testing results of the device(s) under test at different testing stations, and combines and displays the testing results of the device(s) under test, which have been generated, in correspondence to the device(s) under test.

If the SOT signal sequence and the SOT signal sequence prediction value do not match, the control station reports an SOT error massage, and controls the handler to purge the device under test at each of the testing stations, and stores the testing results of the device under test at each of the testing stations in an error report file.

Specifically, the SOT signal prediction value sequence is generated according to the previous testing results at the testing stations, which includes a step of generating a value at the first position of the SOT signal prediction value sequence and a step of generating values at other positions of the SOT signal prediction value sequence.

The step of generating a value at the first position of the SOT signal prediction value sequence is as follow: the value at the first position is 1 if a new device under test enters the first testing station, or the value at the first position is 0 if no new device under test enters the first testing station.

The step of generating values at other positions of the SOT signal prediction value sequence is as follow: the values at the other positions corresponds respectively to the testing results at previous adjacent testing stations of the testing stations, wherein the value at a certain position of the SOT signal prediction value sequence is 1 if a previous testing result at a certain testing station has been passed, wherein the certain position is a position next to the position corresponding to the certain testing station, and the value at the certain position is 0 if the previous testing result at the certain testing station has failed, wherein, 1 represents a high level with the SOT signal, and 0 represents a low level without the SOT signal.

The present disclosure will be described hereafter in conjunction with an embodiment of four testing stations. For the sake of clarity of the description of the present disclosure, terms used in the context are first explained as follows.

The SOT (start of Test) signal is a signal for indicating the start of the present test, which is sent to the PC by the handle after the handle places a device under test at a testing station.

The EOT (End of Test) signal is a signal for indicating the end of the present test, which is sent to the handle by the PC after the PC receives a present testing result at a testing station.

The BIN signal is a signal for representing a category of a tested parameter, which category includes test passing or test failing. The BIN signal is sent by the PC simultaneously when sending the EOT signal.

The SOT signal sequence is a sequence constructed by the PC according to received SOT signals. In this embodiment, for the four testing stations arranged in sequence, the handler puts corresponding devices at the testing stations and then sends out SOT signals in sequence according to SOT sending rules (to be described later), and the PC constructs the SOT signal sequence by the received SOT signals accordingly.

The SOT signal prediction value sequence is a predicted SOT signal sequence that should be received next time, which is constructed by the PC based on the SOT signal sequence constructed by the currently received SOT signals and the testing results at the testing stations in the present time.

The testing method of the present disclosure is described in detail below in conjunction with FIG. 4 to FIG. 10. In the case where the control station is a PC which runs the multi-station concurrent testing software to perform the testing, the method includes the following steps S01 to S05.

In the step S01, each of the testing stations determines whether the testing result is in line with the expectation according to the SOT sending rules, namely according to a previous testing result at an adjacent testing station of said testing station, and on basis of the determination, the handler is controlled to send SOT signal(s) of corresponding testing station(s).

Specifically, the SOT sending rules may be as follows.

In the case where a device under test is placed at the first testing station by the handle, the handler sends an SOT signal corresponding to the first testing station to the PC.

In the case where the device under test is placed at the (N+1)th testing station by the handler (N is more than or equal to 1), if the device under test is tested at the Nth testing station, the PC sends an EOT signal and a BIN signal to the handler of the Nth testing station after the testing result at the Nth testing station is transmitted to the PC via the testing host and the PC determines that the testing result meets the expectation, namely the handler of the Nth testing station receives the EOT signal and the BIN signal indicating that the test at the Nth station has been passed, and the handler sends the SOT signal of the (N+1)th testing station to the PC after the handler places the device under test at the corresponding testing station.

In the case where a device under test is placed at the (N+1)th testing station by the handler (N is more than or equal to 1), if the device under test is tested at the Nth testing station, the PC sends an EOT signal and a BIN signal to the handler of the Nth testing station after the testing result at the Nth testing station is transmitted to the PC via the testing host and the PC determines that the testing result does not meets the expectation of the testing station (that is. the test is not passed), or after the Nth testing station does not carry out the test so that the PC does not receive the testing result at the Nth testing station, namely the handler of the Nth testing station receives the EOT signal and the BIN signal indicating that the test at the Nth testing station does not pass or no test is carried out at the Nth testing station, and the handler does thus not send the corresponding SOT signal of the (N+1)th testing station.

This step is further described in detail below by using an example in which there are four testing stations and four devices under test enter the four testing stations in sequence to be tested respectively.

Figures 4A, 4B:
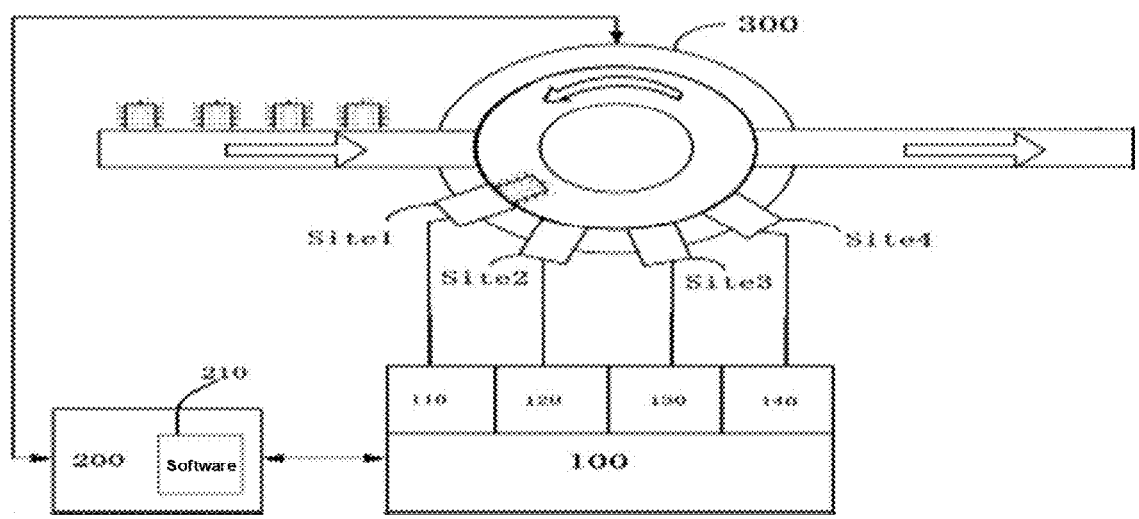
FIG. 4A is a schematic diagram of positions of devices under test at testing stations during a timing sequence A1 according to an embodiment of the present disclosure.
FIG. 4B is a diagram illustrating testing results at the testing stations during the timing sequence A1 according to an embodiment of the present disclosure.

During a timing sequence A1, as shown in FIG. 4A, there is no devices under test at the testing stations except for the device under test DUT1 at the first testing station at the beginning of the test, so the handler sends an SOT signal of the first testing station to the PC, and does not send the SOT signals of the other testing stations to the PC. In this case, the value at a position corresponding to the first testing station is 1, and the values at positions corresponding to the other testing stations are 0.

Figures 5A, 5B:
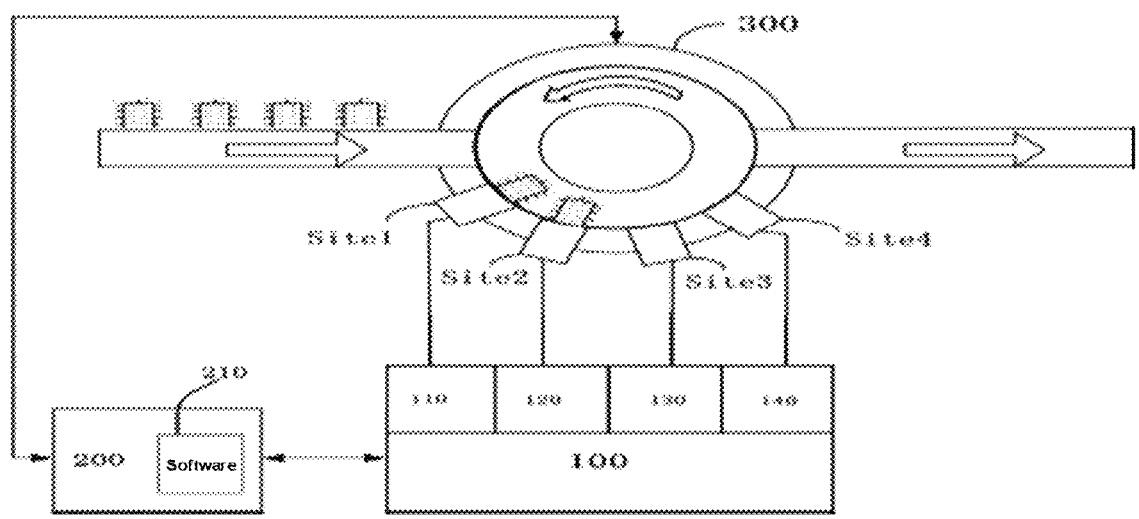
FIG. 5A is a schematic diagram of the positions of the devices under test at the testing stations during a timing sequence A2 according to an embodiment of the present disclosure.
FIG. 5B is a diagram illustrating the testing results at the testing stations during the timing sequence A2 according to an embodiment of the present disclosure.

During a timing sequence A2, as shown in FIG. 5A, the test of the device under test DUT1 at the first testing station has passed and the device under test DUT1 is placed at the second testing station by the handler, and a device under test DUT2 is placed at the first testing station by the handler. At this point, the handler sends the SOT signals of the first and second testing stations to the PC while not sending the SOT signals of the third and fourth testing stations since there are not devices under test at the third and fourth testing stations. In this case, the values at the positions corresponding to the first and the second testing stations are 1, and the values at the positions corresponding to the third and fourth testing stations are 0.

Figures 6A, 6B:
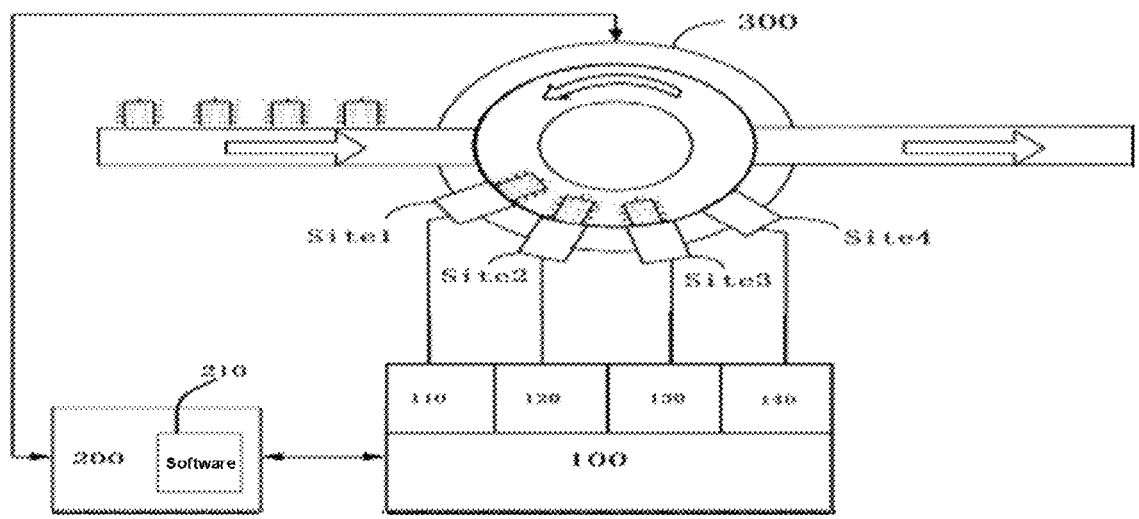
FIG. 6A is a schematic diagram of the positions of the devices under test at the testing stations during a timing sequence A3 according to an embodiment of the present disclosure.
FIG. 6B is a diagram illustrating the testing results at the testing stations during the timing sequence A3 according to an embodiment of the present disclosure.

During a timing sequence A3, as shown in FIG. 6A, when the test of the device under test DUT1 at the second testing station has passed and the device under test DUT1 is placed at the third testing station by the handler, the test of the device under test DUT2 at the first testing station has failed and the device under test DUT2 is placed at the second testing station by the handler, and the device under test DUT3 is placed at the first testing station, the handler sends SOT signals of the first and the third testing stations to the PC. In this case, the values at the positions corresponding to the first and the third testing stations are 1, the value at the position corresponding to the second testing station is 0 because the SOT signal of the second testing station was not sent for this reason that the device under test DUT2 at the second testing station did not pass the test at the first testing station and thus the test of the device under test DUT2 at the second testing station was skipped, and the value at the position corresponding to the fourth testing station is 0 because the SOT signal of the fourth testing station is not sent for this reason that there is no device under test at the fourth testing station.

Figures 7A, 7B:
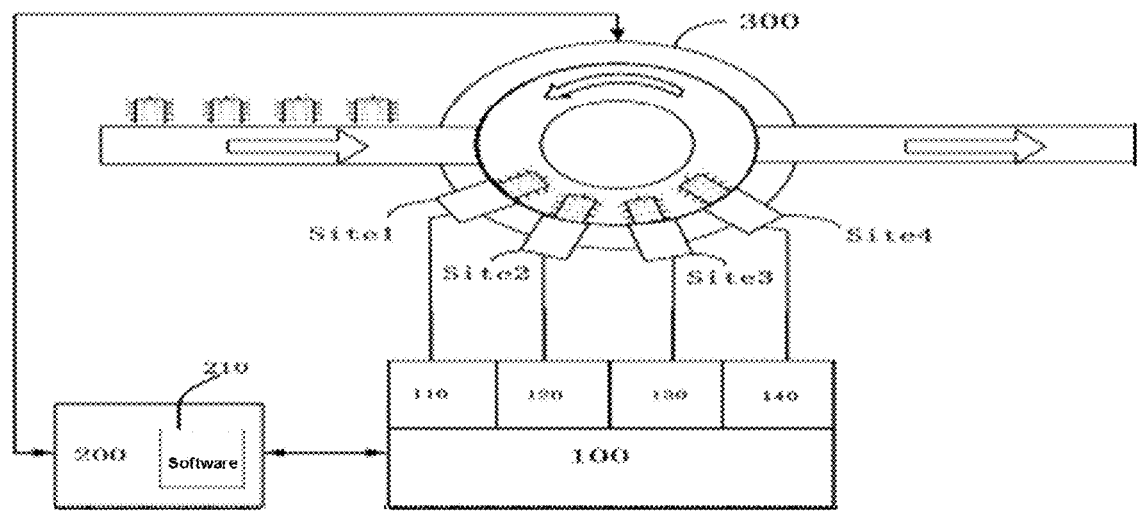
FIG. 7A is a schematic diagram of the position of the devices under test at the testing stations during a timing sequence A4 according to an embodiment of the present disclosure.
FIG. 7B is a diagram illustrating the testing results at the testing stations during the timing sequence A4 according to an embodiment of the present disclosure.

During a timing sequence A4, as shown in FIG. 7A, when the test of the device under test DUT1 at the third device under test has passed and the device under test DUT1 is placed at the fourth testing station by the handler, the device under test DUT2 was not performed the test at the second testing station and is placed at the third testing station by the handler, the test of the device under test DUT3 at the first testing station has passed and the device under test DUT3 is placed at the second testing station, and the device under test DUT4 is placed at the first testing station by the handler, the handler sends the SOT signals of the first, second and fourth testing stations. In this case, the values at the positions corresponding to the first, second and fourth testing stations are 1, and the value at the position corresponding to the third testing station is 0 because the SOT signal of the third testing station is not sent for this reason that the device under test DUT2 at the third testing station was not performed the test at the second testing station.

In the step S02, the PC receives the SOT signals of the corresponding testing stations sent by the handler in turn, and constructs the SOT signal sequence in correspondence to the order of the testing stations.

Figures 8, 9:
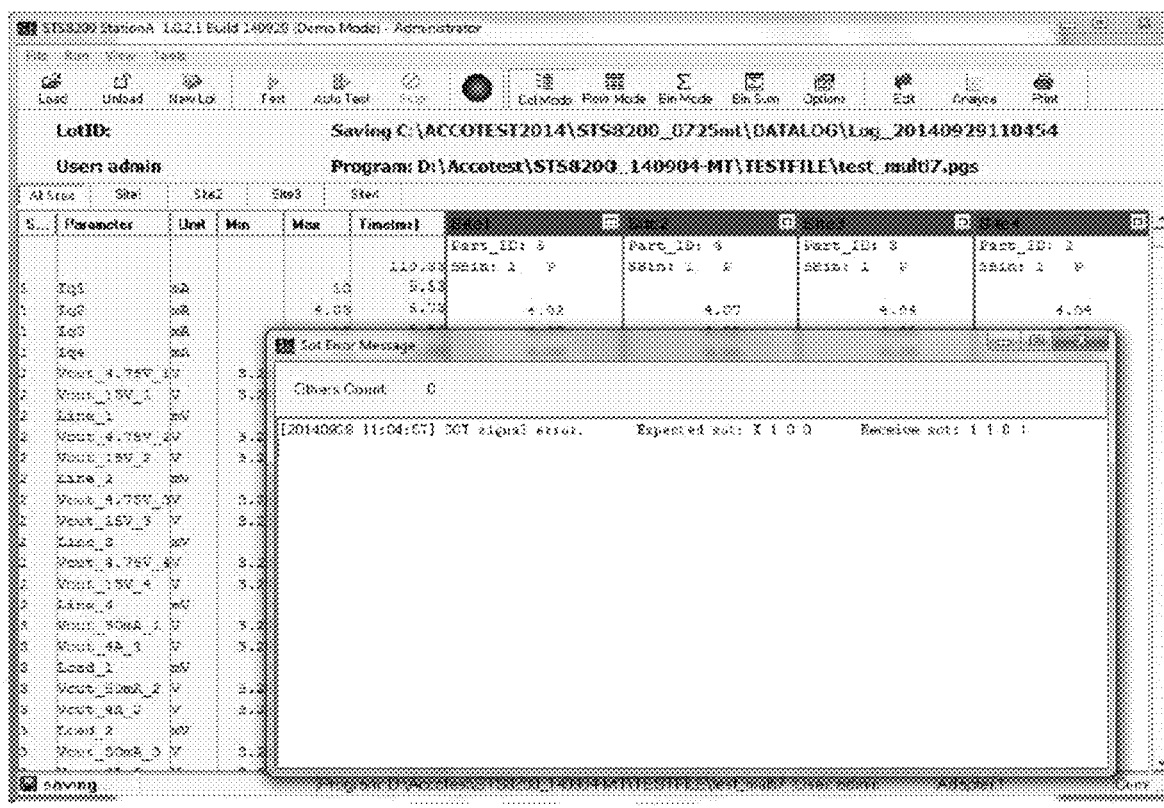
FIG. 8 is a diagram of an SOT signal sequence corresponding the time sequence constructed by a PC according to an embodiment of the present disclosure.
FIG. 9 is a schematic diagram of a SOT error message reported by the PC according to an embodiment of the present disclosure.

As shown in FIG. 8, the four testing stations corresponding to the present example in the step S01 are taken as an example and described as follows, wherein 1 indicates a high level with the SOT signal, and 0 indicates a low level without the SOT signal.

Corresponding to the timing sequence A1, the PC receives the SOT signal of the first testing station sent by the handler, and the SOT signal sequence constructed by the PC is '1000'.

Corresponding to the timing sequence A2, the PC receives the SOT signals of the first and second testing stations sent by the handler, and the SOT signal sequence constructed by the PC is '1100'.

Corresponding to the timing sequence A3, the PC receives the SOT signals of the first and third testing stations sent by the handler, and the SOT signal sequence constructed by the PC is '1010'.

Corresponding to the timing sequence A4, the PC receives the SOT signals of the first, second and fourth testing stations sent by the handler, and the SOT signal sequence constructed by the PC is '1101'.

In the S03, the PC compares the SOT signal sequence with the SOT signal prediction value sequence generated by the PC to determine whether the present SOT signal sequence the prediction value sequence match, wherein if so, the step S04 is carried out, otherwise the step S05 is carried out.

The generation rule of the SOT signal prediction value sequence is as follows. According to the testing results at the testing stations, the SOT signal prediction value of the next testing station is 1 if the test of a device under test at the current testing station has passed and the device under test then enters the next testing station, the SOT signal prediction value of the next testing station is 0 if the test of the device under test at the current testing station is failed and the device under test then enters the next testing station, the SOT signal prediction value of the first testing station is 1 if a new device under test enters the first testing station, and the SOT signal of the testing station is 0 if no device under test enters the first testing station, wherein 1 indicates a high level with the SOT signal, and 0 indicates a low level without the SOT signal. The detailed description is as follows.

The SOT signal prediction value sequence for the timing sequence A1 is generated as follows. As shown in FIG. 4A, before the first test or before the re-test after purging of the devices under test at the testing stations, the handler controls the device under test DUT1 to enter the first testing station, and no device under test enters other testing stations. In this case, the SOT signal prediction value sequence of the PC is set to '1000'.

The SOT signal prediction value sequence for the timing sequence A2 is generated as follows. As shown in FIG. 5A, the test of the device under test DUT1 at the first testing station has passed, the handler controls the device under test DUT1 to enter the second testing station, and controls the device under test DUT2 to enter the first testing station, and no device under test enters other testing stations. In this case, the SOT signal prediction value sequence of the PC is set to '1100'.

The SOT signal prediction value sequence for the timing sequence A3 is generated as follows. As shown in FIG. 6A, the test of the device under test DUT1 at the second testing station has passed, the handler controls the device under test DUT1 to enter the third testing station, the test of the device under test DUT2 at the first testing station has failed, the handler controls the device under test DUT2 to enter the second testing station, the handler controls the device under test DUT3 to enter the first testing station, and no device enters the fourth testing station. In this case, the SOT signal prediction value sequence of the PC is set to '1010'.

The SOT signal prediction value sequence for the timing sequence A4 is generated as follows. As shown in FIG. 7A, the test of the device under test DUT1 at the third testing station has passed, the handler controls the device under test DUT1 to enter the fourth testing station, the test of the device under test DUT2 at the second testing station has failed, the handler controls the device under test DUT2 to enter the third testing station, the test of the device under test DUT3 at the first testing station has passed, the handler controls the device under test DUT3 to enter the second testing station, and the handler controls the device under test DUT4 to enter the first testing station. In this case, the SOT signal prediction value sequence of the PC is set to '1101'.

In the step S04, the present SOT signal sequence and the SOT signal prediction value sequence match, which indicates that the SOT signals sent by the handler are in line with expectation, and the tests of the devices under test are executed at the testing stations according to the SOT signal sequence currently constructed by the PC.

After the tests of the devices under test at the testing stations finished in turn under the control of the handler, the handler conveys device(s) under test the test of which has passed to the next station for taping or packing, and transfers device(s) under test the test of which has failed to the barrel for subsequent re-testing or analyzing.

In the step S05, the present SOT signal sequence and the SOT signal prediction value sequence do not match, which indicates that the SOT signals sent by the handler are not in line with expectation. In this case, the relevant information is recorded in the log file, and the handler moves all the devices under test at the testing stations to a recycle station for purging, and then returns to the step S01 to reload the device under test to start a new testing.

For the devices under test in the recycle station, they can be re-tested to reduce the scrap rate.

In the following, the steps S02-S05 are further described as follows by taking the four testing stations of the example in the step S01 as an example.

Before the first test, or before the re-test after purging of the devices under test at the testing stations, for sake of clarity, a timing sequence A0 is set. Corresponding to the timing sequence A0, the SOT signal prediction value sequence of the PC is set to '1000'.

Corresponding to the timing sequence A1: the SOT signal prediction value sequence generated last round, namely the SOT signal prediction value sequence for the timing sequence A0, is '1000', and it is determined that the SOT signal sequence is '1000', which matches with the SOT signal prediction value sequence. After the timing sequence A1 has elapsed, the PC generates the SOT signal prediction value sequence for next timing sequence according to the testing results, which is '1100'.

Corresponding to the timing sequence A2: it is determined that the SOT signal sequence '1100' constructed by the PC and the SOT signal prediction value sequence '1100' generated during the timing sequence A1 match. And after the timing sequence A2 has elapsed, the PC generates the SOT signal prediction value sequence for the next timing sequence according to the testing results, which is '1010'.

Corresponding to the timing sequence A3: it is determined that the SOT signal sequence '1010' constructed by the PC and the SOT signal prediction value sequence '1010' generated during the timing sequence A2 match. And after the timing sequence A3 has elapsed, the PC generates the SOT signal prediction value sequence for the next timing sequence according to the testing results, which is '1101'.

Corresponding to the timing sequence A4: it is determined that the SOT signal sequence '1010' constructed by the PC and the SOT signal prediction value sequence '1010' generated during the timing sequence A3 match. And after the timing sequence A4 has elapsed, the handler grades the device under test tested at the fourth testing station.

In any of the above timing sequences, if the SOT signal sequence constructed by the PC is not matched with the SOT signal prediction value sequence generated in the previous timing sequence, an SOT error massage is reported, and the handler is controlled to move all devices under test at the testing stations to the recycle station. After purging of the devices under test, the step S01 is repeated to perform a new testing. Cases where the two sequences do not match include the following.

When the device under test that has passed the test at the Nth station is placed at the (N+1)th testing station by the handler, the handler should send an SOT signal of the (N+1)th testing station to the PC. If the PC does not receive the SOT signal sent by the handler, the PC reports the SOT error massage.

When the device under test that did not pass or skipped the test at the Nth testing station is placed at the (N+1)th testing station by the handler, the handler should not send the SOT signal of the (N+1)th testing station to the PC. If the PC receives the SOT signal sent by the handler, the PC reports the SOT error massage.

The other devices under test placed at the testing stations subsequently are tested in a similar manner to the above, which thus is not described in detail.

Hereinafter, the present disclosure is described from the perspective of the above-mentioned respective timing sequences.

During the timing sequence A0, before the first test or before the re-test after purging of the devices under test at the testing stations, the SOT signal prediction value sequence of the PC is set to '1000'. At this time, no device under test exists at each of the testing stations.

During the timing sequence A1, the device under test DUT1 is placed at the first testing station by the handler, and the handler sends the SOT signal corresponding to the first testing station to the PC.

The PC receives the SOT signal of the first testing station sent by the handler, constructs the SOT signal sequence '1000' according to the received SOT signal, and determines that the SOT signal sequence and the SOT signal prediction value sequence '1000' generated during the timing sequence A0 match.

As shown in FIG. 4B, the PC receives the testing results of the corresponding testing stations via the testing host, and displays the testing results of the device under test DUT1 in correspondence to the first testing station, where the parameters tested by the first testing station are ICC, Example, and Vst.

The PC sends the EOT and BIN signals of the first testing station to the handler, and generates the SOT signal prediction value sequence '1100' for the next round (namely the timing sequence A2) according to the SOT signal sequence '1000' and the testing results at the first testing station.

During the timing sequence A2, the handler indicates that the test at the first testing station has passed after receiving the EOT and BIN signals of the first testing station, the device under test DUT1 is placed at the second testing station by the handler, the device under test DUT2 is placed at the first testing station by the handler, and the handler sends the SOT signals of the second and first testing stations to the PC.

The PC receives the SOT signals of the first and second testing station sent by the handler, constructs the SOT signal sequence '1100' according to the received SOT signals, and determines that the SOT signal sequence and the SOT signal prediction value sequence '1100' generated during the timing sequence A1 match.

As shown in FIG. 5B, the PC receives the testing results of the testing stations via the testing host, stores the testing results, and displays the testing results of the device under test DUT2 in correspondence to the first testing station, and displays the testing results of the device under test DUT1 in a manner of combination in correspondence to the second testing station (i.e., including the testing results for the timing sequences A1 and A2). The parameters tested by the second testing station are Vcspre, PSRR and T_delay.

During this timing sequence, the device under test DUT1 has passed the test at the second testing station, and the PC sends the EOT and BIN signals of the second testing station to the handler, where the BIN signal indicates that the test has been passed; the device under test DUT2 has not passed the test at the first testing station, and the PC sends the EOT and BIN signals of the first testing station to the handler, wherein he BIN signal indicates that the test has failed; and according to the SOT signal sequence '1100' of the present round and the testing results at the first testing station and the second testing station, the SOT signal prediction value sequence for the next round (namely the time sequence A3) is generated as '1010'.

During the timing sequence A3, the handler receives the EOT and BIN signals of the second testing station, wherein the BIN signal indicates that the device under test DUT1 has passed the test at the second testing station, and the device under test DUT1 is placed at the third testing station by the handler; the device under test DUT2 has not passed the test at the first testing station and is placed at the second testing station by the handler; the device under test DUT3 is placed at the first testing station by the handler; at this time, the handler sends the SOT signals of the first and third testing stations to the PC, and the SOT signal of the second testing station is not sent by the handler for the reason that the device under test DUT2 has not passed the test at the first testing station.

The PC receives the SOT signals of the first and third testing stations sent by the handler, constructs the SOT signal sequence '1010' according to the received SOT signals, and determines that the SOT signal sequence and the SOT signal prediction time sequence '1010' generated during the timing sequence A2 match.

As shown in FIG. 6B, the PC receives the testing results of the corresponding testing stations via the testing host, stores the testing results, and displays the testing results of the device under test DUT3 in correspondence to the first testing station, does not displays the testing results of the device under test DUT2 in correspondence to the second station because the second testing station skips the test of the device under test DUT2, and displays the testing results of the device under test DUT1 in a manner of combination in correspondence to the third testing stations (i.e., including the testing results for the timing sequences A1, A2, and A3). The parameters tested by the third testing station are Vcspre1 and PSRR 1.

During this timing sequence, the device under test DUT1 has passed the test at the third testing station, and the PC sends the EOT and BIN signals of the third testing station to the handler, where the BIN signal indicates that the test has been passed; the device under test DUT2 has not been tested at the second testing station, and the PC does not send the EOT and BIN signals of the second testing station to the handler; the device under test DUT3 has passed the test at the first testing station, and the PC sends the EOT and BIN signals of the first testing station to the handler, where the BIN signal indicates that the test has been passed; and according to the SOT signal sequence '1010' of the present round and the testing results at the first, second and third testing stations, the SOT signal prediction value sequence for the next round (namely the time sequence A4) is generated as '1101'.

During the timing sequence A4, the handler receives the EOT and BIN signals of the third testing station, wherein the BIN signal indicates that the device under test DUT1 has passed the test at the third testing station, and the device under test DUT1 is placed at the forth testing station by the handler; the device under test DUT2 has not been tested at the second testing station and is placed at the third testing station by the handler; the handler receives the EOT and BIN signals of the first testing station, wherein the BIN signal indicates that the device under test DUT3 has passed the test at the first testing station, and the device under test DUT3 is placed at the second testing station by the handler; the device under test DUT4 is placed at the first testing station by the handler; at this time, the handler sends the SOT signals of the first, second, and fourth testing stations to the PC, and the SOT signal of the third testing station is not sent by the handler for the reason that the device under test DUT2 at the third testing station has not been tested at the second testing station.

The PC receives the SOT signals of the first, second and fourth testing stations sent by the handler, constructs the SOT signal sequence '1101' according to the received SOT signals, and determines that the SOT signal sequence and the SOT signal prediction value sequence '1101' generated during the timing sequence A3 match.

As shown in FIG. 7B, the PC receives the testing results of the corresponding testing stations via the testing host, stores the testing results, displays the testing results of the device under test DUT4 in correspondence to the first testing station, displays the testing results of the device under test DUT3 in a manner of combination in correspondence to the second testing stations (i.e., including the testing results for the timing sequences A3 and A4), does not displays the testing results of the device under test DUT2 in correspondence to the third station because the device under test DUT2 is not tested at the third testing station, and displays the testing results of the device under test DUT1 in a manner of combination in correspondence to the fourth testing stations (i.e., including the testing results for the timing sequences A1, A2, A3, and A4). The parameter tested by the fourth testing station is T_delay1.

During this timing sequence, the device under test DUT1 has passed the test at the fourth testing station, the PC sends the EOT and BIN signals of the third testing station to the handler, where the BIN signal indicates that the test has been passed, and the device under test DUT1 enters the next stage for packaging or other processing; the device under test DUT2 has not been tested at the third testing station, and the PC does not send the EOT and BIN signals of the third testing station to the handler; the device under test DUT3 has passed the test at the second testing station, and the PC sends the EOT and BIN signals of the second testing station to the handler, where the BIN signal indicates that the test has been passed; and the device under test DUT4 has passed the test at the first testing station, and the PC sends the EOT and BIN signals of the first testing station to the handler, where the BIN signal indicates that the test has been passed.

Then, starting again from the above timing sequence A0, a new test is performed.

As shown in FIG. 9, when the PC receives in sequence the SOT signals of corresponding testing stations sent by the handler, and the constructed SOT signal sequence "1101" is not matched with the SOT signal prediction value sequence 'X100' (where X may be 1 or 0, because in some cases there is discontinuous device feeding in the first station), the interface of the testing software run by the PC reports the SOT error massage. In this case, the PC sends an instruction for controlling the handler to move the device under test at each of the testing stations to the recycle station. After the purging of the devices under test, the handler returns to the step S01 to perform a new test from the device feeding.

Figures 10, 11:
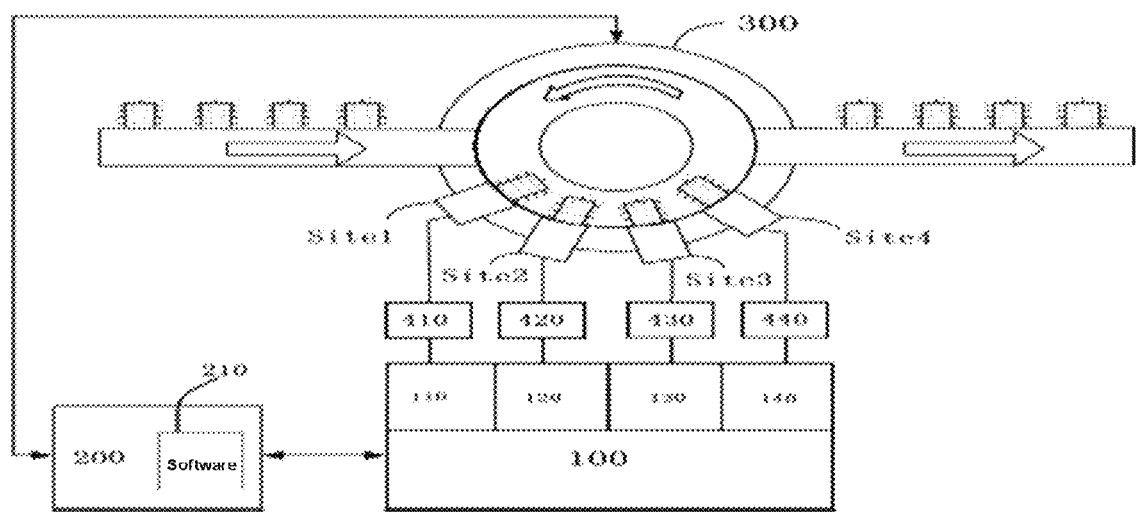
FIG. 10 is a diagram illustrating a file for the SOT error message according to an embodiment of the present disclosure.
FIG. 11 is a schematic diagram of a multi-station concurrent testing apparatus according to a second embodiment of the present disclosure.

As shown in FIG. 10, the SOT error message is stored in an error report file, which is stored in the other folder in the PC under the multi-station concurrent testing software installation directory. The error message includes the generated time of the SOT error massage and the comparison error information between the SOT signal sequence and the SOT signal prediction value sequence so as to be convenient for the operator to perform the subsequent checking.

In summary, in the testing method provided by the present disclosure, after each testing station completes the test, test data at the testing station is generated and sent to the PC by the testing host, the PC integrates the test data according to the previously generated SOT signal predetermined rule and the testing order of the devices under test, and displays, according to the testing station where the device under test is currently located, the testing results and specific parameter data in the testing window corresponding to the testing station, thereby implementing sequential testing and data integration of all parameters of the device under test at the testing stations, and also implementing concurrent testing of multiple devices under test at multiple testing stations, ensuring one-to-one correspondence between the devices under test and the test data, preventing data dislocation and omission, saving test time and test cost, and improving test efficiency.

As shown in FIG. 11, a second embodiment of the present disclosure further provides a multi-station concurrent testing apparatus, which includes a control station 200 and a testing host 100 that are sequentially connected in a communication manner, wherein the control station 200 is installed with multi-station concurrent testing software 210, and the control station 200 may use a PC or other processor that supports installation of the multi-station concurrent testing software 210.

The control station 200 and the testing host 100 are in communication connection by using a bus. The testing host 100 includes a plurality of hardware modules 110, 120, 130 and 140, which are in communication connection with testing boxes 410, 420, 430, 440 respectively. The testing boxes integrate testing resources of the hardware modules, and are connected with at least one testing station, respectively, to form the first to fourth testing stations Site1, Site2, Site3 and Site4. The four testing stations are used for testing a part of parameters of the devices under test, respectively, and uploading testing results of the part of parameters via the testing host 100 to the control station 200.

The testing apparatus further includes a handler 300 in communication connection with the control station 200 and used for controlling the entry and exit of the devices under test and switching among the testing stations, wherein sensors are mounted on the handler 300 and can detect the in-position states of the devices under test on the handler.

The communication means between the control station 200 and the handler 300 includes GPIB, TTL, RS232, and the like.

The embodiment is suitable for the situation where the device under test is required to be closer to the testing box, whose principle is consistent with that of the above multi-station concurrent testing method in performing the multi-station concurrent testing, and the description thereof is thus omitted herein.

Figure 12:
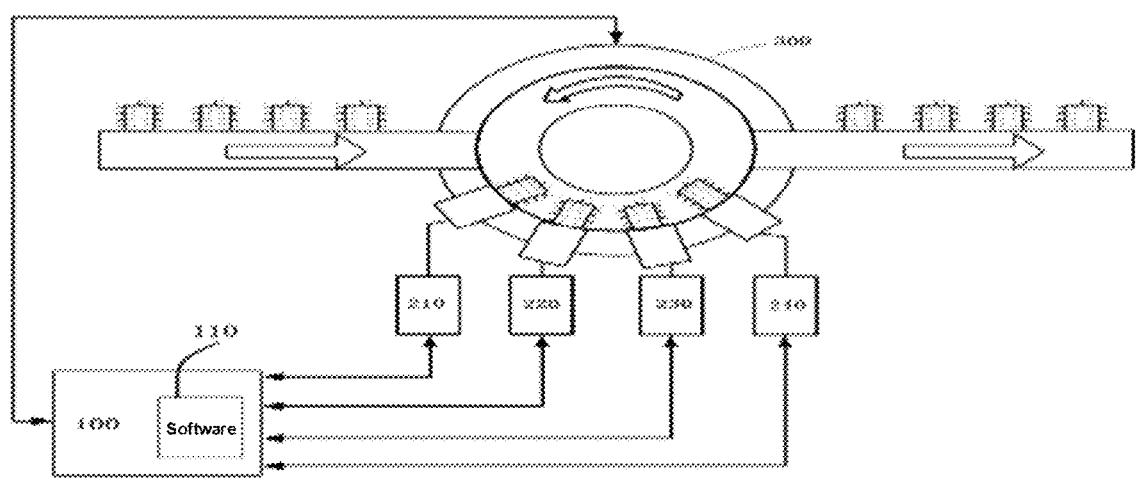
FIG. 12 is a schematic diagram of a multi-station concurrent testing apparatus according to a third embodiment of the present disclosure.

As shown in FIG. 12, a third embodiment of the present disclosure further provides a multi-station concurrent testing apparatus, which includes a control station 100 on which a multi-station concurrent testing software 110 is installed. The control station 100 may use a PC or other processor supporting installation of the multi-station concurrent testing software 110.

The testing apparatus further includes a plurality of testing hardware (or called testing stations) 210, 220, 230 and 240 respectively in communication with the control station 100. The testing hardware are each used for testing a part of parameters of the devices under test, and uploading the testing results of the part of parameters to the control station 100.

The testing apparatus also includes a handler 300 which is in communication connection with the control station 100 and is used for controlling the entry and exit of the devices under test and switching on the testing stations, wherein sensors are arranged on the handler 300 and can detect the in-position states of the devices under test on the handler;

The communication means between the control station 100 and the handler 300 includes GPIB, TTL, RS232 and the like.

The multi-station concurrent testing apparatus provided in this embodiment has the same principle as the above multi-station concurrent testing method in performing multi-station concurrent testing, and the description thereof is thus omitted herein.

The above description is only for the purpose of illustrating the preferred embodiments of the present disclosure and is not intended to limit the present disclosure. Any modification, equivalent replacement, improvement, etc. made within the spirit and principle of the present disclosure shall be included within the scope of protection of the present disclosure.

What is claimed is:

1. A multi-station concurrent testing method, including a control station, a plurality of testing stations which are respectively in communication connection with the control station, and a handler in communication connection with the control station, wherein different testing stations are configured to test a part of parameters of devices under test and provide the parameters to the control station, and the handler is configured for conveying the devices under test to be placed at the testing stations in sequence, said method comprising:
 a step A in which the control station controls the handler to send start of test (SOT) signal(s) of corresponding testing station(s) based on previous testing results at adjacent testing stations of the testing stations;
 a step B in which the control station constructs an SOT signal sequence based on the received SOT signal(s) and in correspondence to orders of the testing stations; and
 a step C in which the control station compares the SOT signal sequence and an SOT signal prediction value sequence generated by the control station, wherein if the SOT signal sequence and the SOT signal prediction value sequence match, the corresponding testing station(s) executes the test of device(s) under test, and otherwise, the handler is controlled to purge the devices under test at the testing stations, wherein the SOT signal prediction value sequence is generated based on previous testing results at the testing stations.

2. The method of claim 1, wherein the step A comprises:
 when a device under test is placed at a first testing station by the handler, the handler sends the SOT signal of a first testing station;
 when the device under test is placed at a (N+1)th testing station by the handler, N is more than or equal to 1, the handler sends a corresponding SOT signal of a (N+1)th testing station if the testing result of the device under test at a Nth testing station is an expected result, and the handler does not send the corresponding SOT signal of the (N+1)th testing station if the testing result is not an expected result or the test is skipped.

3. The method of claim 1, wherein the step B comprises:
 if the SOT signal of one of the testing stations is received, a value at a position of the SOT signal sequence corresponding to that testing station is 1, and otherwise, the value at the position is 0.

4. The method of claim 3, wherein the step C in which the SOT signal prediction value sequence is generated based on previous testing results at the testing stations comprises:
 a step of generating a value at a first position of the SOT signal prediction value sequence: the value at the first position is 1 when a new device under test enters a first testing station, and the value at the first position is 0 when no new device under test enters the first testing station; and
 a step of generating values at other positions of the SOT signal prediction value sequence: the values at the other positions corresponds respectively to the testing results at previous adjacent testing stations of the testing stations, wherein the value at a certain position of the SOT signal prediction value sequence is 1 if a previous testing result at a certain testing station has been passed, and wherein the certain position is a position next to the position corresponding to the certain testing station, and the value at the certain position is 0 if the previous testing result at the certain testing station has failed.

5. The method of claim 1, wherein after the corresponding testing station(s) executes the test of device(s) under test, the step C further comprises:
 the control station stores the testing results of the devices under test at different testing stations, and combines and displays the testing results of the devices under test, which have been generated, in correspondence to the devices under test.

6. The method according to claim 1, wherein after purging the devices under test at the testing stations, the step C further comprises:
 reporting a SOT error message, and storing the error message in an error report file.

7. The method of claim 1, wherein ends of the handler in contact with the devices under test are installed with sensors for detecting in-position states of the devices under test on the handler.

8. A control station comprising a processor and multi-station concurrent testing software running on the processor, wherein the multi-station concurrent testing software performs:
 a step A of controlling, according to previous testing results of adjacent testing stations of testing stations, a handler to send start of test (SOT) signal(s) of corresponding testing station(s);
 a step B of constructing an SOT signal sequence according to the received SOT signal(s) and in correspondence to orders of the testing stations; and
 a step C of comparing the SOT signal sequence and a SOT signal prediction value sequence generated by the control station, wherein if the SOT signal sequence and the SOT signal prediction value sequence match, the corresponding testing station(s) executes the test of device(s) under test, and otherwise, the handler is controlled to purge the devices under test at the testing stations,
 wherein the SOT signal prediction value sequence is generated according to previous testing results at the testing stations.

9. The control station according to claim 8, wherein the step A comprises:
 when a device under test is placed at a first testing station by the handler, the handler sends the SOT signal of the first testing station; and
 when the device under test is placed at a (N+1)th testing station by the handler, N is more than or equal to 1, the handler sends corresponding SOT signal of a (N+1)th testing station if the testing result of the device under test at a Nth testing station is an expected result, and the handler does not send the corresponding SOT signal of the (N+1)th testing station if the testing result is not an expected result or the test is skipped.

10. The control station according to claim 8, wherein the step B comprises:
  if the SOT signal of one of the testing stations is received, a value at a position of the SOT signal sequence corresponding to that testing station is 1, and otherwise, the value at the position is 0.

11. The control station of claim 10, wherein the step of the step C in which the SOT signal prediction value sequence is generated according to previous testing results at the testing stations comprises:
  a step of generating a value at a first position of the SOT signal prediction value sequence: the value at the first position is 1 when a new device under test enters a first testing station, and the value at the first position is 0 when no new device under test enters the first testing station; and
  a step of generating values at other positions of the SOT signal prediction value sequence: the values at the other positions corresponds respectively to the testing results at previous adjacent testing stations of the testing stations, wherein the value at a certain position of the SOT signal prediction value sequence is 1 if a previous testing result at a certain testing station has been passed, wherein the certain position is a position next to the position corresponding to the certain testing station, and the value at the certain position is 0 if the previous testing result at the certain testing station has failed.

12. The control station of claim 8, wherein after the corresponding testing station(s) executes the test of device(s) under test, the step C further comprises:
  storing the testing results of the devices under test at different testing stations, and combining and displaying the testing results of the devices under test, which have been generated, in correspondence to the devices under test.

13. The control station of claim 8, wherein after purging the devices under test at the testing stations, the step C further comprises:
  reporting a SOT error message, and storing the error message in an error report file.

14. A multi-station concurrent testing apparatus, comprising the control station according to claim 8, including a plurality of testing stations which are respectively in communication connection with the control station, and a handler in communication connection with the control station, wherein different testing stations are configured to test a part of parameters of devices under test and provide the testing results of parameters to the control station, and the handler is configured for conveying the devices under test to be placed at the testing stations in sequence.

15. The apparatus according to claim 14, wherein ends of the handler in contact with the devices under test are installed with sensors for detecting in-position states of the devices under test on the handler.

\* \* \* \* \*